(12) United States Patent
Kopley et al.

(10) Patent No.: US 6,350,663 B1
(45) Date of Patent: Feb. 26, 2002

(54) METHOD FOR REDUCING LEAKAGE CURRENTS OF ACTIVE AREA DIODES AND SOURCE/DRAIN DIFFUSIONS

(75) Inventors: Thomas Edward Kopley; Dietrich W Vook, both of Menlo Park, CA (US); Thomas Dungan, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/517,635

(22) Filed: Mar. 3, 2000

(51) Int. Cl.$^7$ .............................................. H01L 21/76
(52) U.S. Cl. ........................ 438/448; 438/57; 257/291
(58) Field of Search .................. 438/448, 57, 73, 438/66, 48, 202; 257/291, 292, 396, 373–376

(56) References Cited

U.S. PATENT DOCUMENTS 5,614,744 A * 3/1997 Merrill ....................... 257/291
5,847,433 A 12/1998 Kerber ....................... 257/369
5,950,079 A 9/1999 Honeycutt et al. ........... 438/199

* cited by examiner

Primary Examiner—David Nelms
Assistant Examiner—Dung A Le

(57) ABSTRACT

A fabrication method for providing isolation between adjacent regions of an integrated circuit includes providing a guard layer over field edges that are the interfaces between field oxide regions and diffusion regions in which dopant is introduced. The guard layer will inhibit introduction of dopant along the field-edge, so that a substantially dopant-free transition strip is formed. The transition strip inhibits current leakage from the active region to the field oxide region. In one embodiment, the active region is an active area diode, such as used to form an Active Pixel Sensor (APS) pixel. The guard layer is biased so as to further inhibit current leakage during circuit operation. In another embodiment, the method is used in the fabrication of transistors for APS pixels having an overlay photodiode structure.

4 Claims, 16 Drawing Sheets

METHOD FOR REDUCING LEAKAGE CURRENTS OF ACTIVE AREA DIODES AND SOURCE/DRAIN DIFFUSIONS

TECHNICAL FIELD

The invention relates generally to methods for providing isolation between adjacent regions of an integrated circuit and more particularly to methods of reducing current leakage from an active region to a field oxide region in a circuit, such as an image sensor circuit.

BACKGROUND ART

Complementary metal-oxide-semiconductor (CMOS) technology is used in the design and fabrication of integrated circuits for many types of applications. CMOS technology uses n-type transistors (NMOS) and p-type transistors (PMOS) that are formed by doping selected regions of a substrate and by forming layers on the substrate. A p-type material, such as boron, may be introduced to a bulk silicon substrate in a blanket ion implantation step. Field oxide regions and n-type regions may then be formed using well known integrated circuit fabrication techniques. Similarly, the processes for depositing conductive and dielectric layers on the substrate to complete the circuit are known.

One general area for applying CMOS technology that has received significant attention is image capture and processing. Imaging applications include video, still photography, and navigation that is based upon optical detection. Linear or two-dimensional arrays of pixels are formed along the surface of the substrate, with each pixel periodically generating a signal having a current or voltage level that is indicative of the intensity of light incident to that pixel. A typical three-transistor pixel 10 that is used in current CMOS image sensors is shown in FIG. 1. Sensors that use this technology are often referred to as CMOS active pixel sensors (APS). A timing diagram for the operation of the three-transistor pixel 10 is shown in FIG. 2. In typical operation, a node N1 is set to a predetermined voltage $V_{dd'}$ (which may be different than the circuit operating voltage $V_{dd}$) by turning on an n-channel reset transistor 12. The state of the reset transistor is determined by controlling a reset voltage ($V_{reset}$). In FIG. 2, $V_{reset}$ goes high at time T0, causing the node N1 to ramp to $V_{dd'}$. At time T1, the reset transistor 12 is turned off and photoelectrons are generated by the incident light on a photodiode 14. The photoelectrons are injected into node N1, reducing the voltage on that node by a value of $V_{sense=Vdd'}-(I_{photo} \times T_{illuminate}/C_{N1})$. In this equation, $I_{photo}$ is the photocurrent induced by the incident light, $T_{illuminate}$ is the illumination time period and $C_{N1}$ is the capacitance on node N1. Both $V_{dd'}$ and $V_{sense}$ can in principle be read out of the pixel through a source-follower 16 by activating a row-select transistor 18. In a two-dimensional array of pixels, there typically are row-select transistors and column-select transistors that allow the pixels to be sequentially sampled. The row-select transistor 18 is activated by manipulating a row-select (RS) signal. The illumination on the pixel is then proportional to $V_{dd'}-V_{sense} = I_{photo} \times T_{illuminate}/C_{N1}$. Persons skilled in the art refer to this operation as Correlated Double Sampling (CDS). Sampling occurs at time T2 before $T_{illuminate}$ and time T3 during $T_{illuminate}$. The pixel is reset at time T4, since $V_{reset}$ is caused to go high.

One of the major problems of using CMOS technology in imaging sensors is the relatively large dark current intrinsic to the CMOS process. A significant cause of the large dark current is the reverse-bias diode leakage in the photodiode 14 of a pixel, as well as in the source diffusion of the MOS field effect transistor (MOSFET) 12 connected to the photodiode. The diode leakage is often dominated by the edge leakage currents. Furthermore, in deep-submicron generations of CMOS technology, this leakage current will only increase and take major engineering efforts to suppress.

The physical layout of the CMOS APS pixel 10 of FIG. 1 will be described with reference to FIGS. 3, 4 and 5. FIG. 3 is a top view of the circuit layout of the APS pixel of FIG. 1, showing the various layers and diffusion regions. FIG. 4 is a top view that isolates the active area diode of FIG. 3, while FIG. 5 is a side sectional view of FIG. 4. The active area diode is illustrated as being an n+/p diode fabricated in a p-substrate or p-well. However, the descriptions of the operations and problems apply equally to a p+/n diode in an n-substrate or n-well. The pn-junction of the diode 14 is defined by the p-substrate or p-well 20, which will be referred to as the p-layer. Electrical connections 22 and 24 to the diode are formed by depositing layers that are in contact with an n+ region 26 and a p+ region 28, respectively. The n+ region 26 may be formed by ion implantation or other doping techniques into the active area that is identified as the photodiode 14 in FIG. 3. The active area is delineated by a field oxide (FOX) region 30. Typically, the FOX region is a thick layer of silicon dioxide ($SiO_2$) that electrically isolates the active area from other regions of the substrate, which is typically a silicon substrate. There are several well known processes for forming the FOX. Any of the processes may be used to form the FOX of FIGS. 3–5. However, each of the known processes is susceptible to the formation of a high density of defects at the edges of the FOX. The defects are primarily due to mechanical stress effects and contamination. The high density of defects located within the pn-junction diode's depletion region contributes to the high reverse-bias leakage current found at the field-edge of the diode. There has been much research and development regarding providing process steps (such as oxide deposition, etching and annealing) that minimize the edge leakage. However, the edge leakage problem is expected to become worse as the CMOS process is applied at the deep-submicron level.

Referring specifically to FIGS. 1 and 3, the gates of the three transistors 12, 16 and 18 are formed by a patterned polysilicon layer. The polysilicon layer is identified by hatching in FIG. 3. The reset transistor 12 has a gate 32, the row-select transistor 18 has a gate 34, while the transistor 16 has a gate 36 that is electrically coupled to the N1 node 22. The source/drain regions of the three transistors are formed by diffusions using the appropriate dopants. As can be seen in FIGS. 1 and 3, the transistors 16 and 18 have source/drain regions that are formed by a common diffusion region 38.

Dark current in the CMOS APS pixel 10 with an active area photodiode 14 is caused mainly by the photodiode leakage, which bleeds charge from the node 22 (N1). This reduces the voltage on the node, even when the reset transistor 12 is turned off during the illumination time $T_{illuminate}$. Therefore, the diode leakage produces an offset in the differential voltage produced by the illumination, given by $V_{dd'}-(I_{photo}+I_{dark}) \times T_{illuminate}/C_{N1}$. For low light illumination, it is possible for $I_{dark}$ to be approximately the same as $I_{photo}$. Thus, the dark current limits the dynamic range of the image sensor. Dark current reduction has usually been addressed by attempting to lower the intrinsic diode leakage of the CMOS technology via processing steps. This minimization of the diode leakage characteristics is very difficult in advanced deep-submicron CMOS technologies that use advanced field oxide formation techniques and have much higher doping concentrations in the diode.

Field-edge leakage can also be a significant problem at the transistor level of the pixel 10. Each of the three MOSFETs 12, 16 and 18 is formed by growing a thin gate oxide over the active area of the transistor and then forming the gates 32, 34 and 36 by patterning strips of polysilicon over the thin gate oxide. The n+ dopant is implanted after the gates have been formed. For each transistor, two separate n+/p diodes are then simply the source and drain diffusions in combination with the p+ contact. Because the source and drain diffusions are delineated by field oxides on three sides, they have the same field-edge leakage problem as the isolated n+/p diode.

There have been attempts to isolate active components of two complementary transistors. One such attempt is described in U.S. Pat. No. 5,847,433 to Kerber, which is not related to imaging applications. In order to produce isolated active regions of a CMOS circuit, a field plate is formed and doped jointly with wells located between the field plate. Therefore, the field plate includes an n-doped region and a p-doped region, as well as a boundary region between the two doped regions. Each doped region is electrically connected to the well that is located beneath it. As a result, a flat band condition prevails at the substrate surface. While the Kerber method provides an improvement, dark current leakage is still a problem, particularly in imaging applications.

What is needed is an integrated circuit fabrication method that is applicable to imaging applications and that provides further reductions in the edge leakage component of diodes and source/drain diffusions of MOSFETs.

SUMMARY OF THE INVENTION

A fabrication method for providing isolation between regions of an integrated circuit includes forming a guard layer on a peripheral portion of at least one of two adjacent regions of a substrate, so that when dopant is introduced into the substrate, an intermediate transition strip is left substantially dopant-free. The transition strip inhibits current leakage from an active region to an adjacent region, which is preferably a field oxide region. In the preferred embodiment, the active region is an active area diode, such as the one used in an Active Pixel Sensor (APS) pixel. Also in the preferred embodiment, the guard layer is a conductive material that is connected to a source of a bias voltage. For an APS pixel, the biased guard layer blocks the doping of the active area diode during fabrication and effectively blocks edge leakage current during circuit operation, as long as the guard layer is biased below the threshold voltage of the MOS system in which it is formed. The use of some process technologies will require bias in accumulation.

In one embodiment, the guard layer is formed of a patterned conductive material (such as polysilicon) on the peripheral portion of the active region. The guard layer extends across the peripheral portion to at least the edge of the adjacent field oxide region. Optionally, the guard layer extends onto a peripheral portion of the field oxide region, thereby relaxing the alignment tolerances. The overlap of the guard layer onto the active area will depend upon factors such as the alignment specifications of the photolithography tools used in the fabrication technology, but will typically be about the same as the overlap of the guard layer onto the field oxide region, if such an overlap is utilized. Since depositing polysilicon is a standard part of a CMOS circuit, such a modification of the existing active area diode is relatively simple to accomplish.

In an alternative application, the guard layer is patterned conductive material that extends along the interface between a source/drain region of a MOSFET and a field oxide region. The dopant-free transition strip that is formed by using the guard layer as a shield in a subsequent step of introducing dopant into the source/drain region isolates the doped region from the field oxide region. In this embodiment, the guard layer is preferably formed of polysilicon and is simultaneously formed with and connected to the gate of the MOSFET. When the gate is biased to a high voltage (i.e., the MOSFET is turned on), there will be an inversion layer generated under the guard layer, thereby extending along the interface of the source/drain region and the field oxide edge. Optionally, the guard layer may be patterned about both of the source/drain regions. Connecting the polysilicon guard layer to the gate of the MOSFET has advantages with regard to fabrication simplicity. However, the practice may result in an unacceptable leakage level (due to the gate-edge leakage) and/or an unacceptable increase in source/drain capacitance. In addition, because of the standard overlap of the gate region onto the source/drain regions, gate-to-source/drain capacitance will increase. If the extra leakage or capacitance is problematic, it is possible to separate the gate polysilicon from the polysilicon guard layer. In this case, the polysilicon guard layer should be biased by another contact.

In a third embodiment, the guard layer is used for MOSFETs that share diffusions. MOSFETs that share a common diffusion are often used in CMOS circuits to lower the total layout area. By depositing the guard layer along the interface between an adjacent field oxide region and a common diffusion region, edge leakage is reduced. In this embodiment, the guard layer may be connected to one of the gates of the two MOSFETs, but not both, unless the two gates are tied to the same circuit node. For applications in which the two transistors are operated separately, the guard layer may be connected to one of the two gates or may be connected to a separate contact.

An advantage of the invention is that depositing the guard layer prior to introducing the dopant into an active region provides control over edge leakage without significantly diverging from existing fabrication techniques. In the preferred embodiment, the guard layer is formed of polysilicon that is formed at the same time as the gates of the transistors. The guard layer has the same thickness as the gates and preferably has the same width, but this is not critical.

DETAILED DESCRIPTION

As previously noted, one of the major problems of using CMOS technology in imaging sensors, such as those used in video, still photography and optical navigation, is that the CMOS process has a relatively large inherent dark current. One of the major causes of the large dark current is the reverse-bias diode leakage in the photodiode. This diode leakage is dominated in many cases by edge leakage currents. The invention that will be described with reference to FIGS. 6–8 will address this cause. Another cause is the reverse-bias diode leakage in the source/drain diffusions of MOSFETs connected to the photodiode. The means of addressing this cause of the large dark current will then follow.

Figure 1:
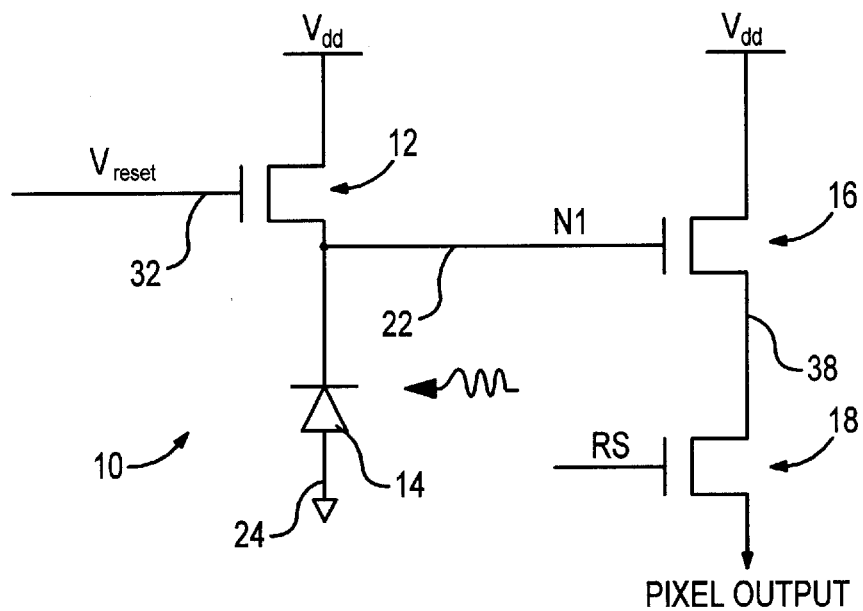
FIG. 1 is a schematic of a three-transistor CMOS Active Pixel Sensor (APS) pixel for use in imaging applications.
Figure 3:
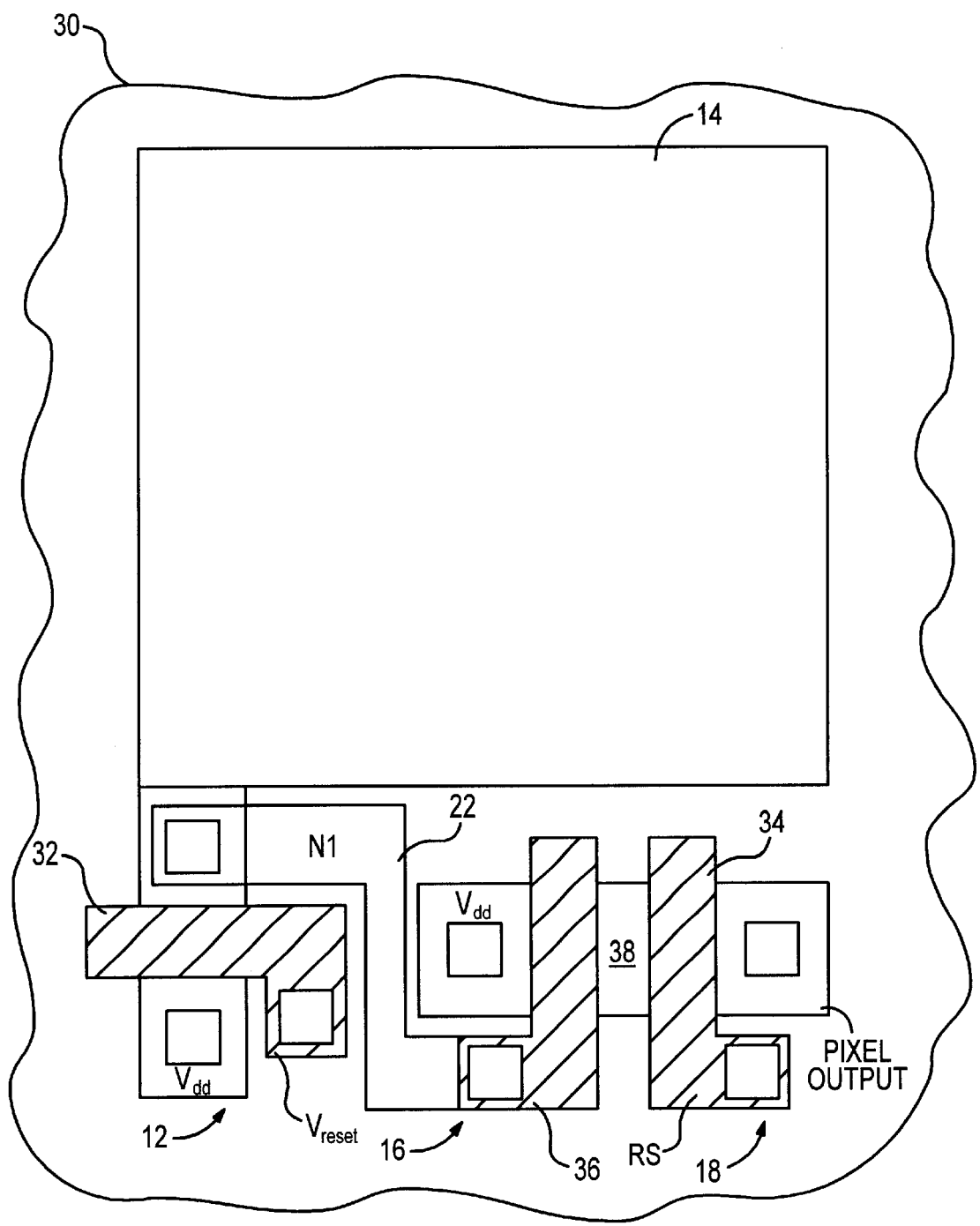
FIG. 3 is a top view of a prior art circuit layout of layers and diffusion regions for forming the APS pixel of FIG. 1.
Figure 6:
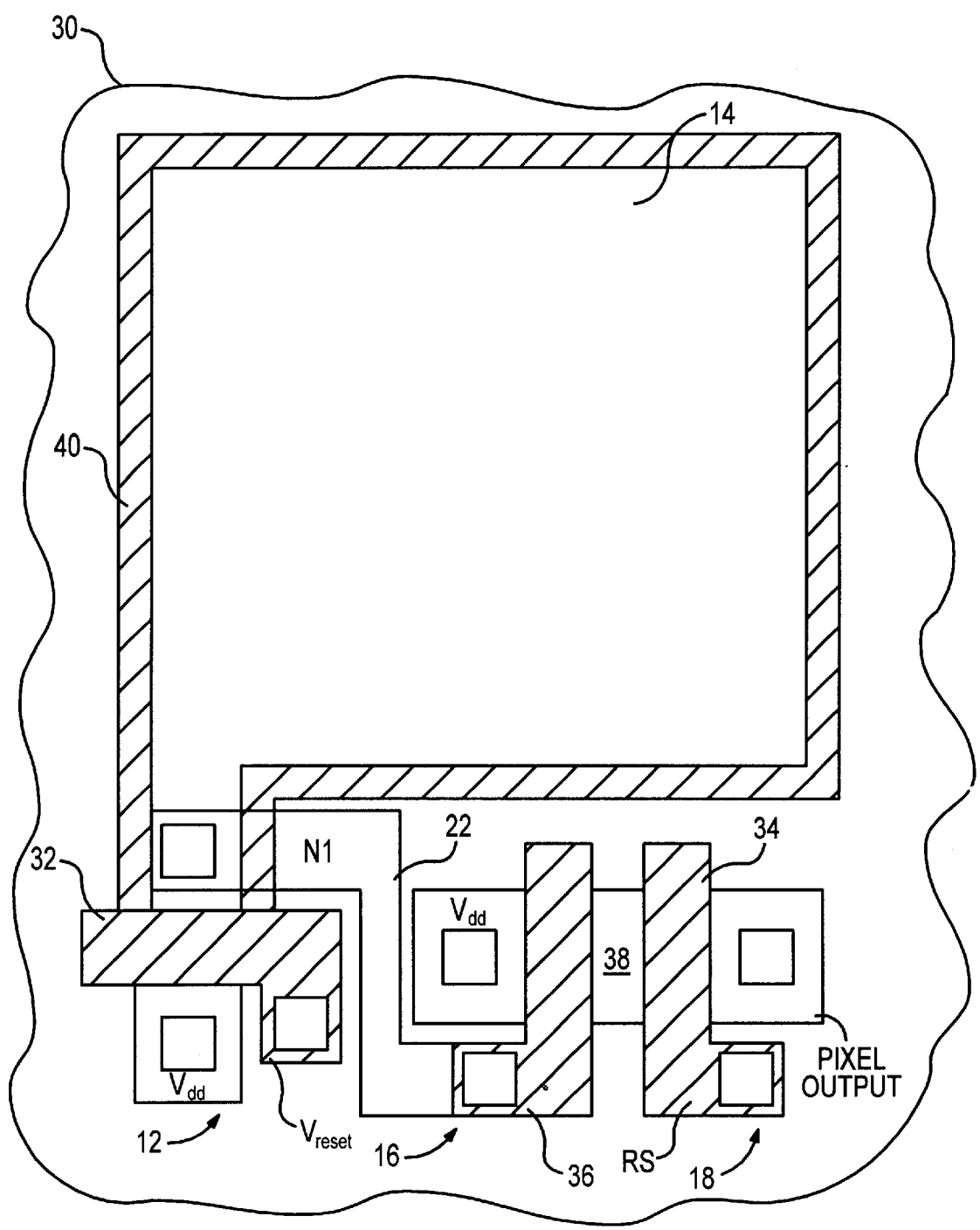
FIG. 6 is a top view of a circuit layout of layers and diffusion regions for forming the APS pixel of FIG. 1, but with a leakage-control guard layer in accordance with one embodiment of the invention.

With reference to FIG. 6, the circuit layout that is shown is consistent with the circuit layout of FIG. 3. However, a guard layer 40 (shown as being hatched) has been incorporated into the fabrication of the photodiode 14. The guard layer is preferably formed of polysilicon at the same time that the three polysilicon gates 32, 34 and 36 are formed. Since the incorporation of the guard layer does not affect the schematic representation of the electrical circuit, the reference numerals that were used in FIGS. 1 and 3 are also used in FIG. 6. The polysilicon guard layer 40 is formed before the dopant is introduced into the active area of the photodiode. Therefore, the polysilicon guard layer will block the n+ implant, leaving a transition strip below the portion of the guard layer that overlaps the region surrounded by the field oxide 30.

Figure 4:
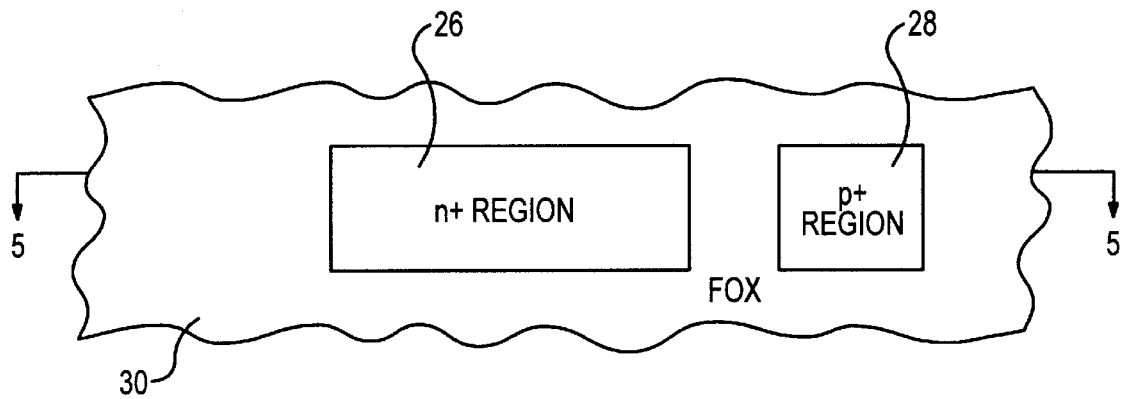
FIG. 4 is a top view of a simplification of the photodiode of the APS pixel of FIGS. 1 and 3.
Figure 5:
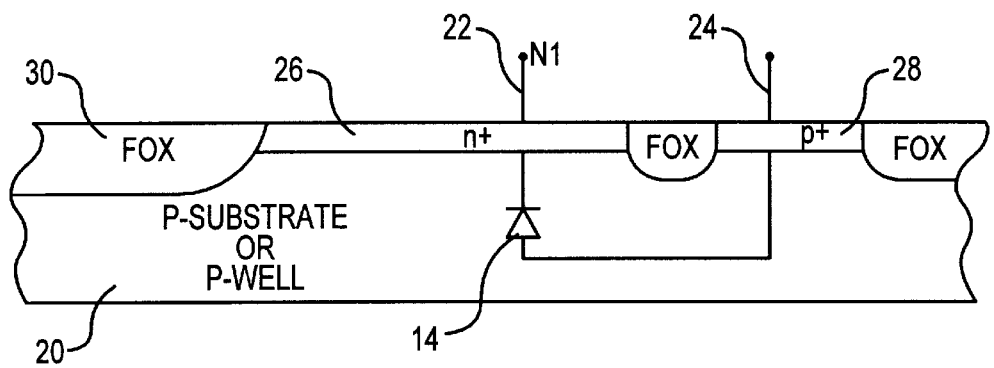
FIG. 5 is a side sectional view of the photodiode of FIG. 4, taken along lines 5—5.
Figure 7:
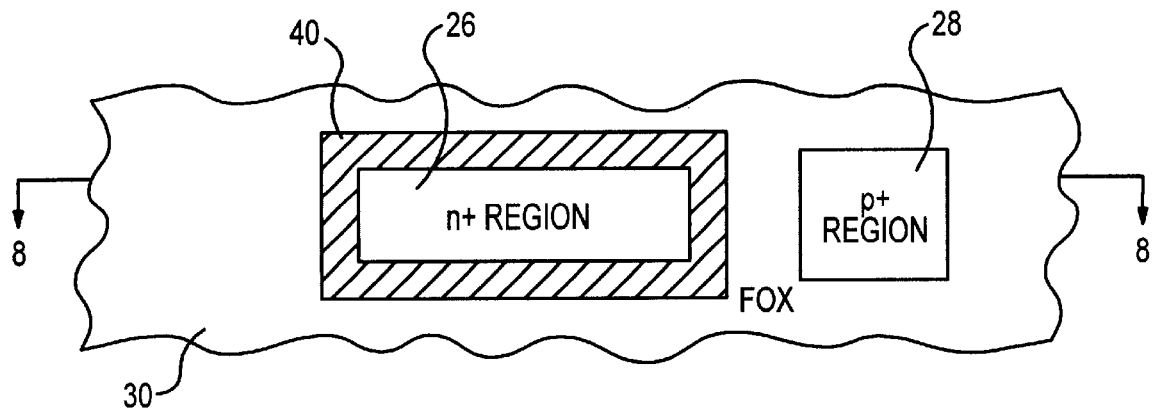
FIG. 7 is a top view of the photodiode of FIG. 6.
Figure 8:
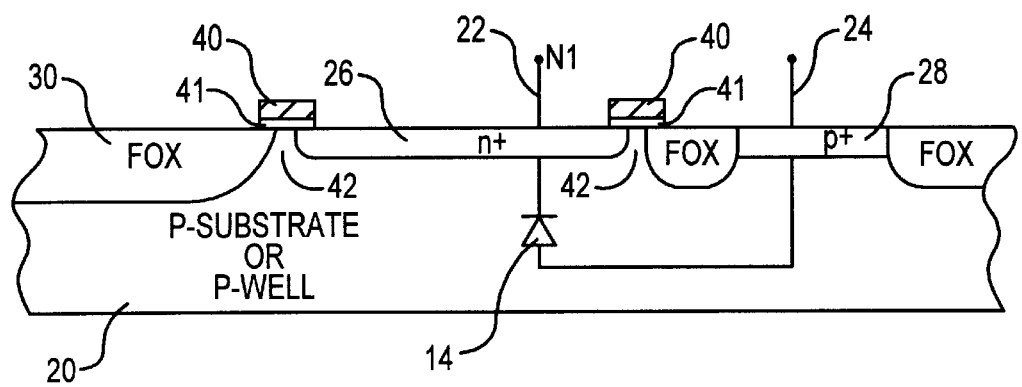
FIG. 8 is a side sectional view of the photodiode of FIG. 7, taken along lines 8—8.

FIGS. 7 and 8 correspond to FIGS. 4 and 5, but include the polysilicon guard layer 40. The transition strip 42 that is substantially dopant free can be seen in FIG. 8. The polysilicon guard layer 40 is illustrated as being deposited on a portion of the gate oxide layer that is used in forming the gates of the three transistors. This provides further compatibility between the conventional steps of forming the transistor gates and the steps for forming the guard layer. However, other approaches may be utilized. For example, if the guard layer 40 is to be allowed to have a "floating" potential, rather than being biased, the portion of the gate oxide layer 41 below the guard layer 40 may be eliminated. This would short the guard layer to the n+ region 26.

Figure 2:
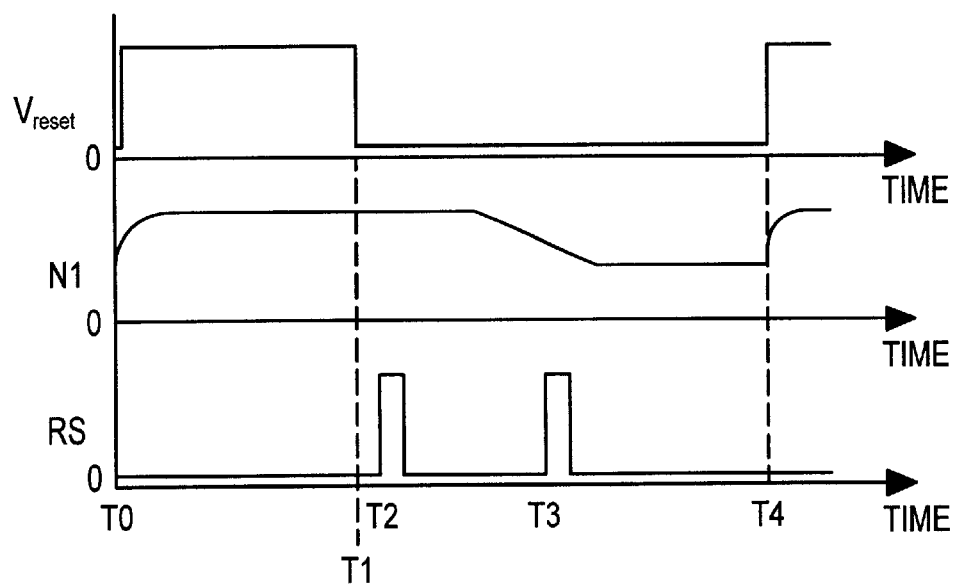
FIG. 2 is a timing diagram for the three signals controlled in the operation of the APS pixel of FIG. 1.

As seen in FIG. 6, the guard layer 40 connects to the gate 32 of the reset transistor 12. During the illumination period, the gate of the reset transistor is at 0 volts (as indicated in the timing diagram of FIG. 2). The bias of the guard layer provides a reduction in dark current. For CMOS processes that do not exhibit the expected leakage current reduction at 0 volts, it is possible to bias the guard layer 40 at a lower voltage, so as to bring the underlying silicon into accumulation. This may be performed by separating the guard layer from the gate 32 and providing a separate electrical connection to a fixed source of a negative voltage. Alternatively, the reset transistor 12 may be driven to a negative gate voltage, rather than a 0 voltage. In either case, the simple circuit layout technique mitigates the need of extensive and expensive technology development to ensure low dark current in CMOS APS pixels 10.

During fabrication, the polysilicon guard layer 40 blocks the implantation of dopant, as indicated by the transition strip 42 in FIG. 8. During operation, the guard layer is biased below the threshold voltage of the MOS system in which it is formed. Consequently, the n+ region 26 will be electrically and structurally isolated from the field oxide edge 30. It follows that the edge component of diode leakage will be reduced. How much of a reduction of leakage current that is obtained will depend on the exact processing steps used to fabricate the diode 14. This is because at a typical guard layer bias of 0 volts, there is a depletion region under the polysilicon that can still allow leakage current as a result of field-edge defects. However, as noted above, if leakage currents are not sufficiently reduced, it is possible to bias the polysilicon so as to bring the underlying substrate region into accumulation. In this case, there should be no contribution to leakage from the field-edge defects.

The overlap of the guard layer onto the active area diode 14 will depend upon the alignment specifications of the photolithography tools used in the technology. Typically, the overlap will be approximately the same as the overlap length of the guard layer onto the field oxide region 30.

A comparison of FIGS. 5 and 8 shows that the use of the guard layer 40 reduces the area of the n+ region 26. Consequently, the sensitivity to light will be reduced. If one wants to retain the same active diode area, the structure of the diode can be increased in size.

While the guard layer has been described as being formed of polysilicon, this is not critical. Other materials may be substituted. Preferably, the material is conductive, so that it can be biased below the threshold voltage of the MOS system. However, the use of a dielectric guard layer provides some of the advantages of the polysilicon guard layer, if it blocks the dopant implantation during the fabrication process. Also in the preferred embodiment, the guard layer is not removed after the dopant implantation step, but applications in which the guard layer is removed have been contemplated.

Figure 9:
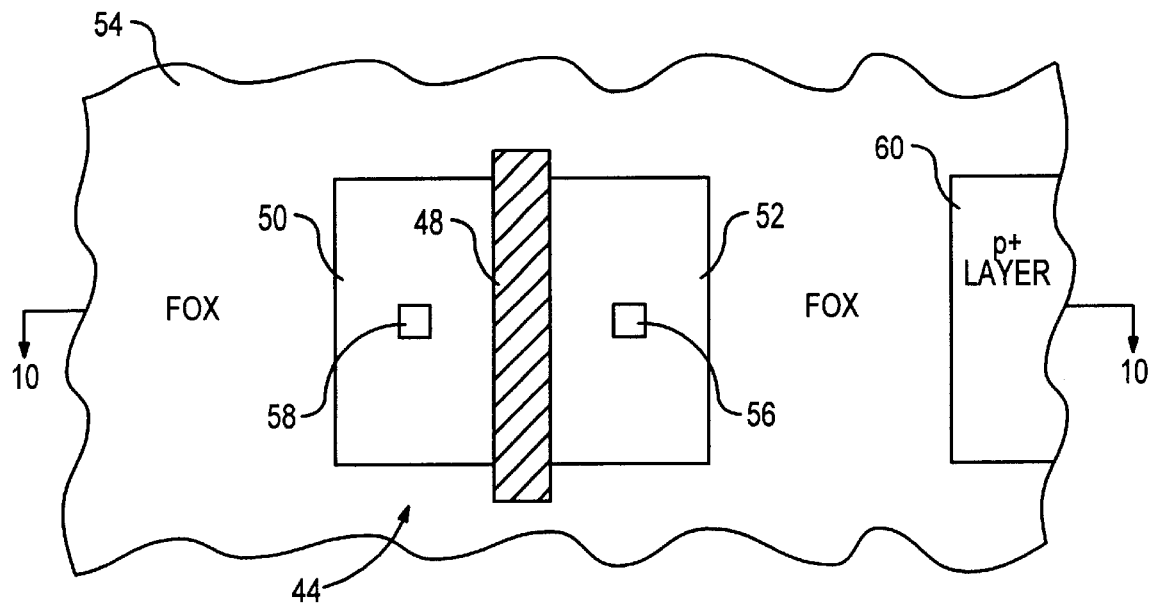
FIG. 9 is a top view of a simplification of a transistor in accordance with the prior art.
Figure 10:
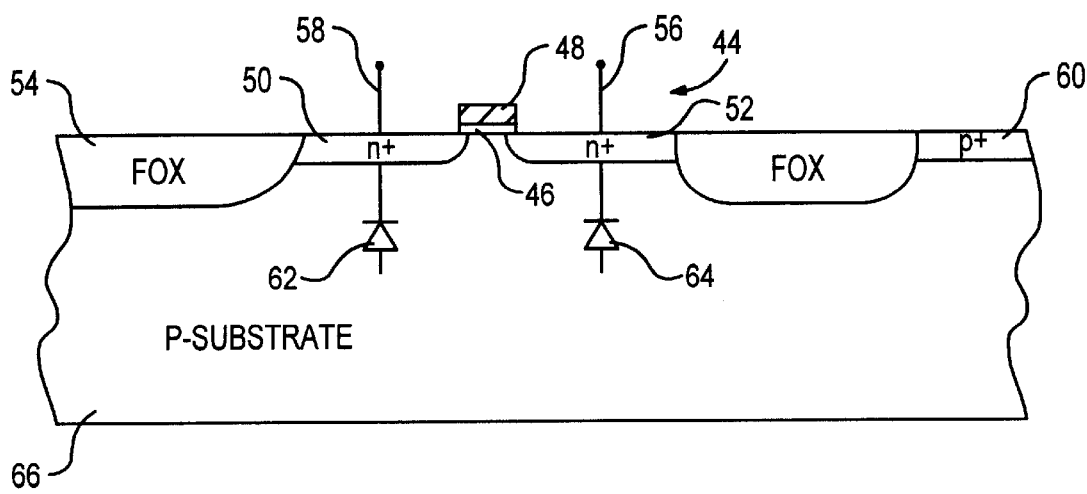
FIG. 10 is a side sectional view of the prior art transistor of FIG. 9, taken along lines 10—10.

Similar to the active area diode, the MOSFET diffusions that form the source/drain regions of the transistors can benefit from the use of a guard layer over the field-edge that forms their boundaries. The conventional MOSFET transistor is shown in FIGS. 9 and 10. A MOSFET 44 is formed by growing a thin gate oxide 46 over the active area of the transistor. A layer of polysilicon is then formed over the gate oxide 46 by material deposition and pattern etching. This provides the gate 48 of the MOSFET. The source/drain regions 50 and 52 are then formed by implantation of an n+ dopant that extends to a field oxide region 54. Contacts 56 and 58 may be patterned to reside on the source/drain regions. A p+ layer 60 is also shown in FIGS. 9 and 10.

Figure 11:
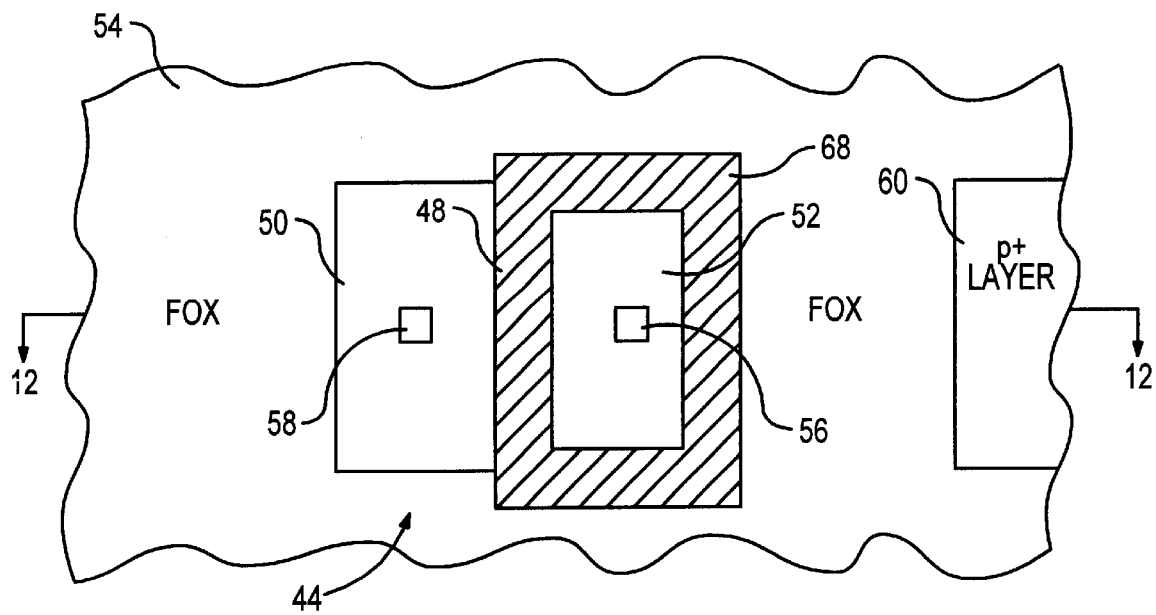
FIG. 11 is a top view of the transistor of FIG. 9, but with a guard layer formed in accordance with an embodiment of the invention.
Figure 12:
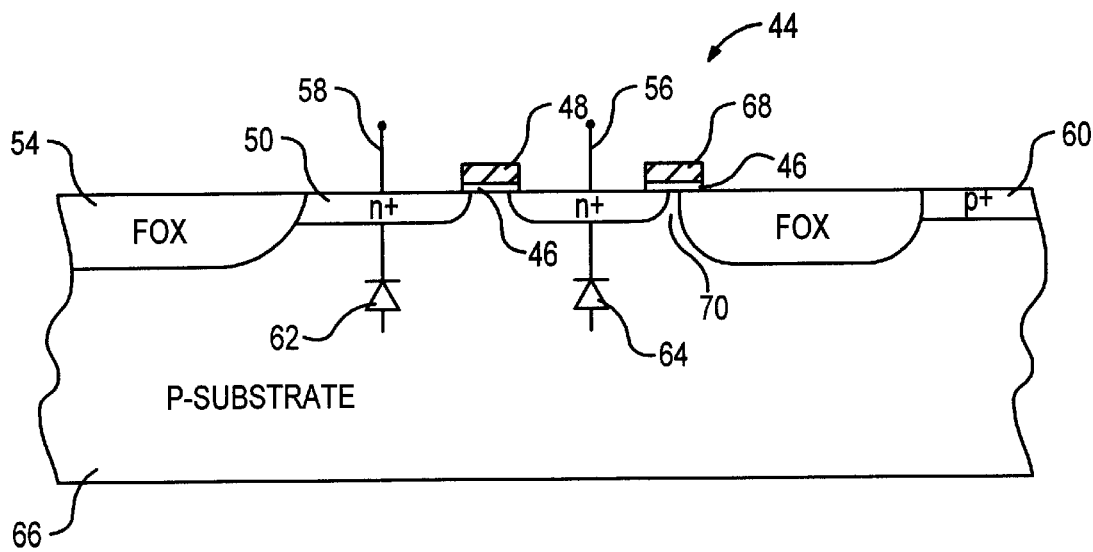
FIG. 12 is a side sectional view of the transistor of FIG. 11, taken along lines 12—12.

As a result of the fabrication process, two separate n+/p diodes 62 and 64 are formed, with the source/drain regions providing the n+ contact and the substrate 66 providing the p contact. Because the source and drain diffusions are delineated on three sides by the FOX 54, they have the same field-edge leakage problem as the active area diode described above. Referring now to FIGS. 11 and 12, the formation of the gate oxide 46 and the polysilicon that forms the gate 48 can be extended to provide a guard layer 68 around the drain region 52 of the transistor 44. While the illustration shows the guard layer as being applied only to the drain region, it is possible to achieve the same benefits for the source region 50 if the guard layer is patterned over the edge of the source region along the FOX 54. Optionally, the guard layer can be formed about both of the source/drain regions.

Figure 13:
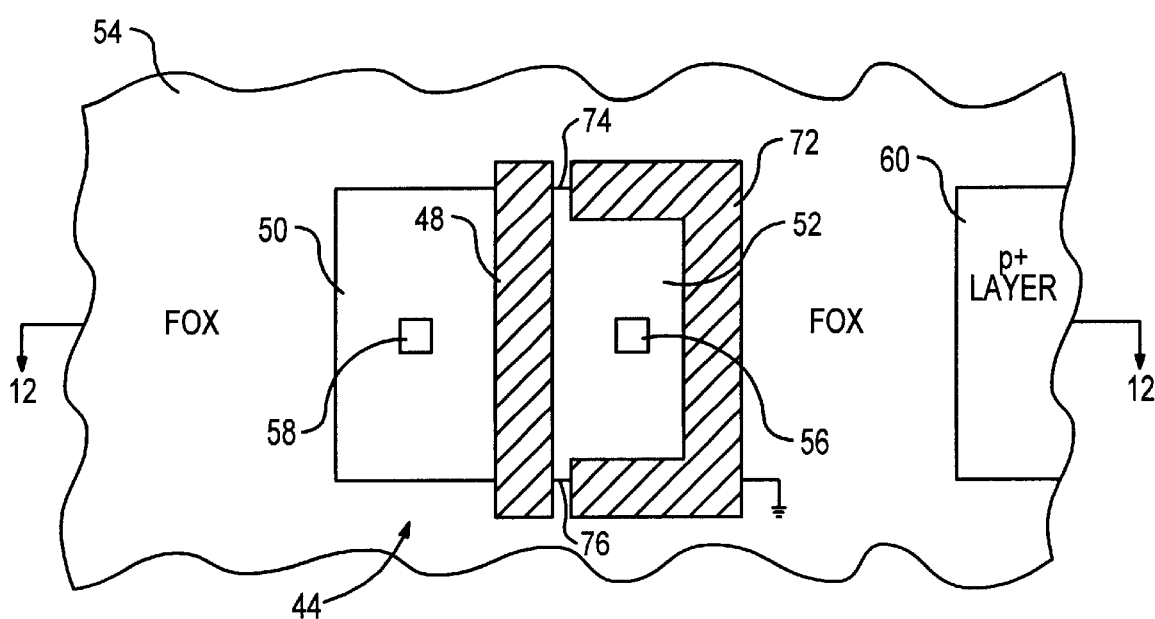
FIG. 13 is a top view of the transistor of FIG. 9, but with a guard layer in accordance with another embodiment of the invention.

By forming the guard layer 68 prior to introducing the dopant into the source/drain regions 50 and 52, a transition strip 70 that is substantially free of dopant is formed at the edge of the FOX 54. This provides the same advantages described with reference to FIGS. 4–8. Specifically, the edge component of the diode leakage is significantly reduced. However, when the guard layer 68 is connected to the gate 48 in the manner shown in FIG. 11, the bias of the gate to a high voltage (FET turned on) will create an inversion layer below the entire polysilicon to extend the n+ region 26 to the FOX 54. The result may be an increased leakage (due to gate-edge leakage) and extra source/drain capacitance. In addition, because of the standard overlap of the gate onto the source/drain regions, gate-to-source/drain capacitance is increased. If the extra leakage or capacitance is problematic, it is possible to separate the gate polysilicon 48 from the polysilicon material that forms the guard layer. This embodiment is shown in FIG. 13. Preferably, the guard layer 72 of FIG. 13 is biased by connection to a fixed source of voltage (e.g., 0 volts). The drain region 52 will have small links 74 and 76 in which the diffusion region contacts the FOX 54, so as to contribute to leakage current. The dimensions of the links 74 and 76 will depend upon the spacing rule of the technology's polysilicon. The extra leakage will be negligible for large MOSFETs.

Figure 14:
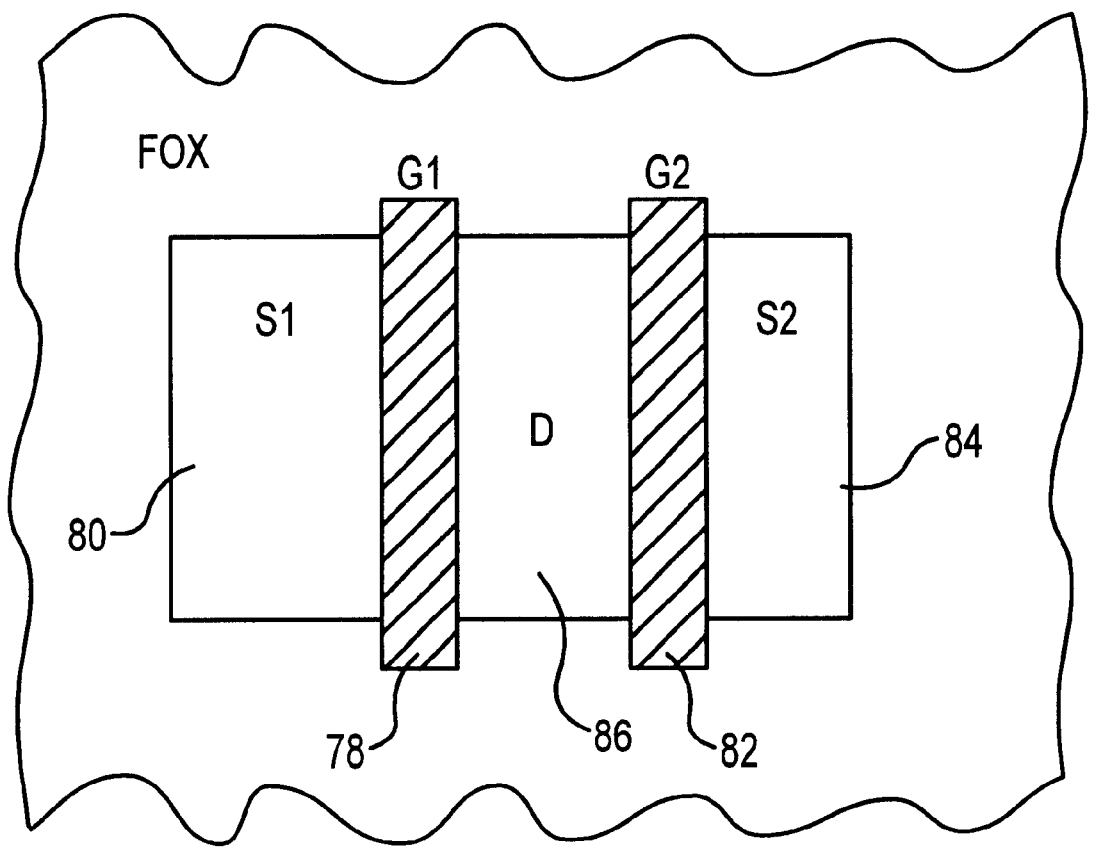
FIG. 14 is a top view of a simplification of adjacent MOSFETs that share a common diffusion in accordance with the prior art.

The invention is also applicable to MOSFETs that share diffusions. The conventional structure is shown in FIG. 14. A pair of MOSFETs are shown in a side-by-side arrangement. The first transistor includes a polysilicon gate 78 and a source region 80, while the second transistor includes a polysilicon gate 82 and a diffused source region 84. The two transistors share a drain 86 diffusion. MOSFETs that share a common diffusion are often used in CMOS circuits to lower the total layout area.

Figure 15:
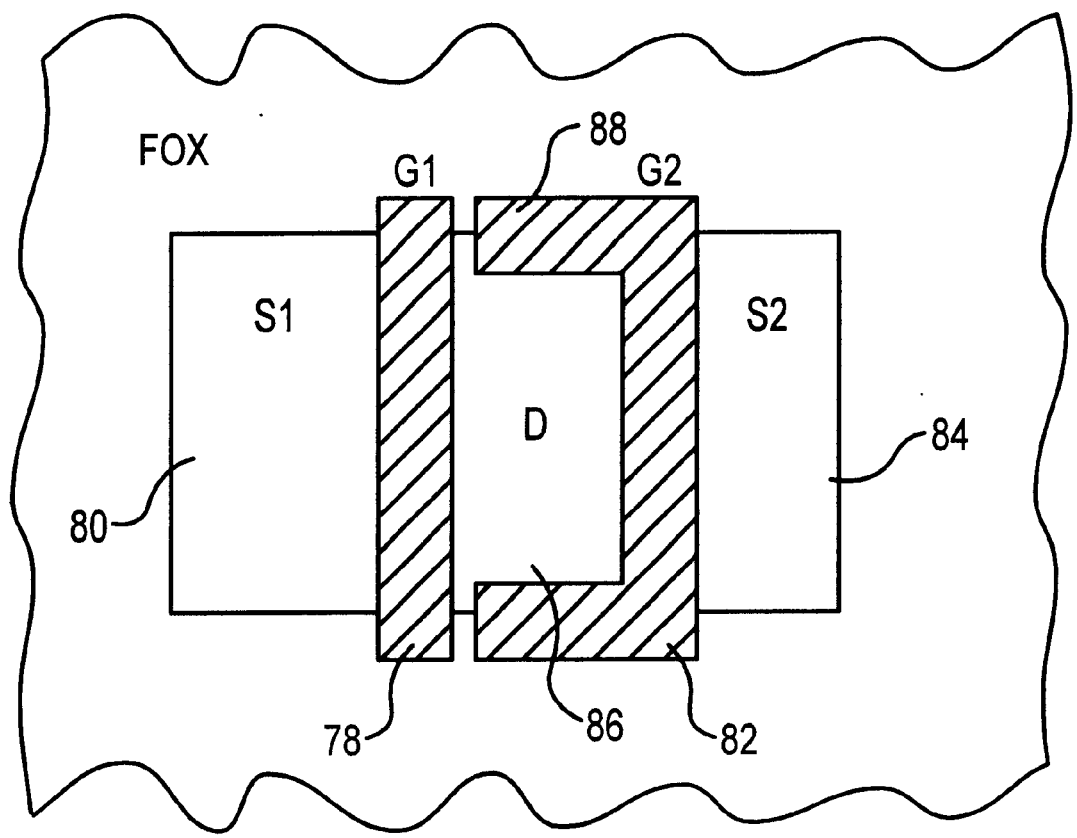
FIG. 15 is a top view of one embodiment of forming a guard region along the common diffusion of FIG. 14 in accordance with the invention.

Referring now to FIG. 15, the common drain 86 has reduced leakage as a result of a polysilicon guard 88 that is formed on opposite sides of the common drain. In the embodiment of FIG. 15, the guard 88 is connected to the second gate 82 in order to provide a bias. The guard is separated from the first gate 78, so that the two gates are not shorted. Of course, if the gates are tied to a single circuit node, the polysilicon guard 88 can be connected to both gates. This gate-to-gate coupling is particularly useful for MOSFETs with multiple gate fingers.

Figure 16:
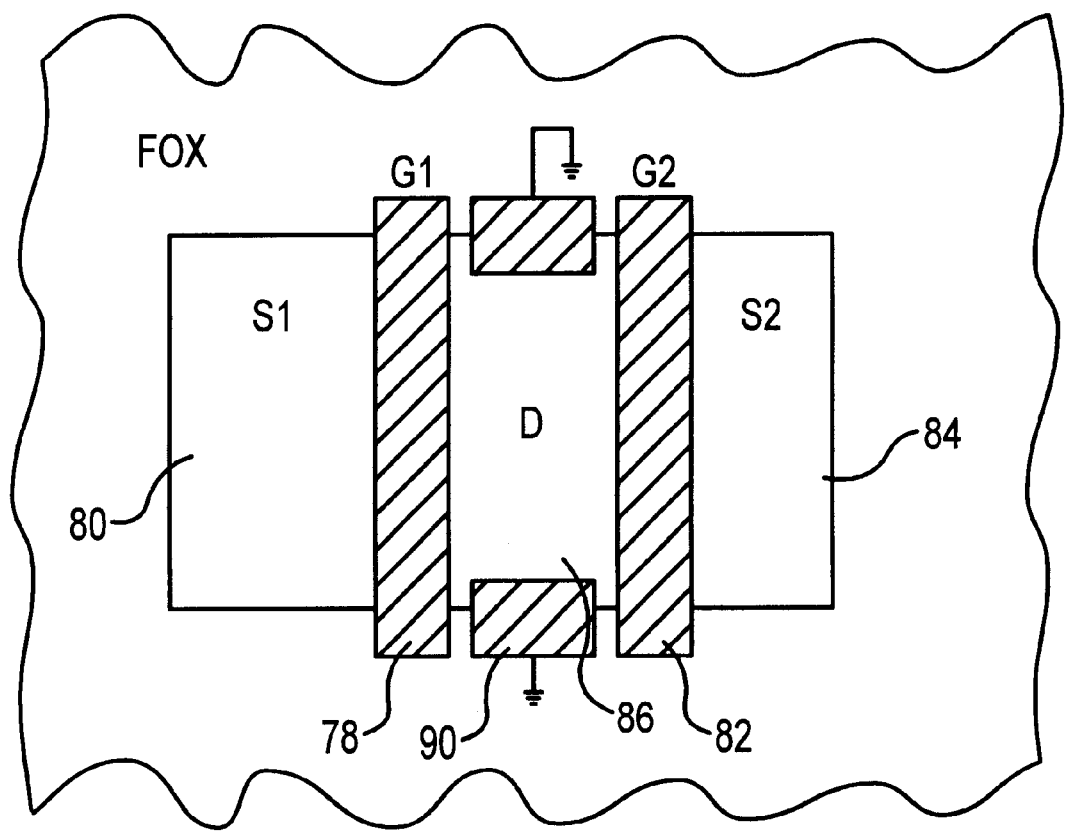
FIG. 16 is a top view of another embodiment of forming a guard layer for the common diffusion of FIG. 14 in accordance with the invention.

FIG. 16 shows a modification of the embodiment of FIG. 15. In this embodiment, the guard layer 90 is electrically separated from both of the gates 78 and 82. As previously noted, this approach may be used to reduce drain capacitance. The guard 90 of FIG. 16 is preferably connected to a source of a fixed voltage, such as electrical ground.

Figure 17:
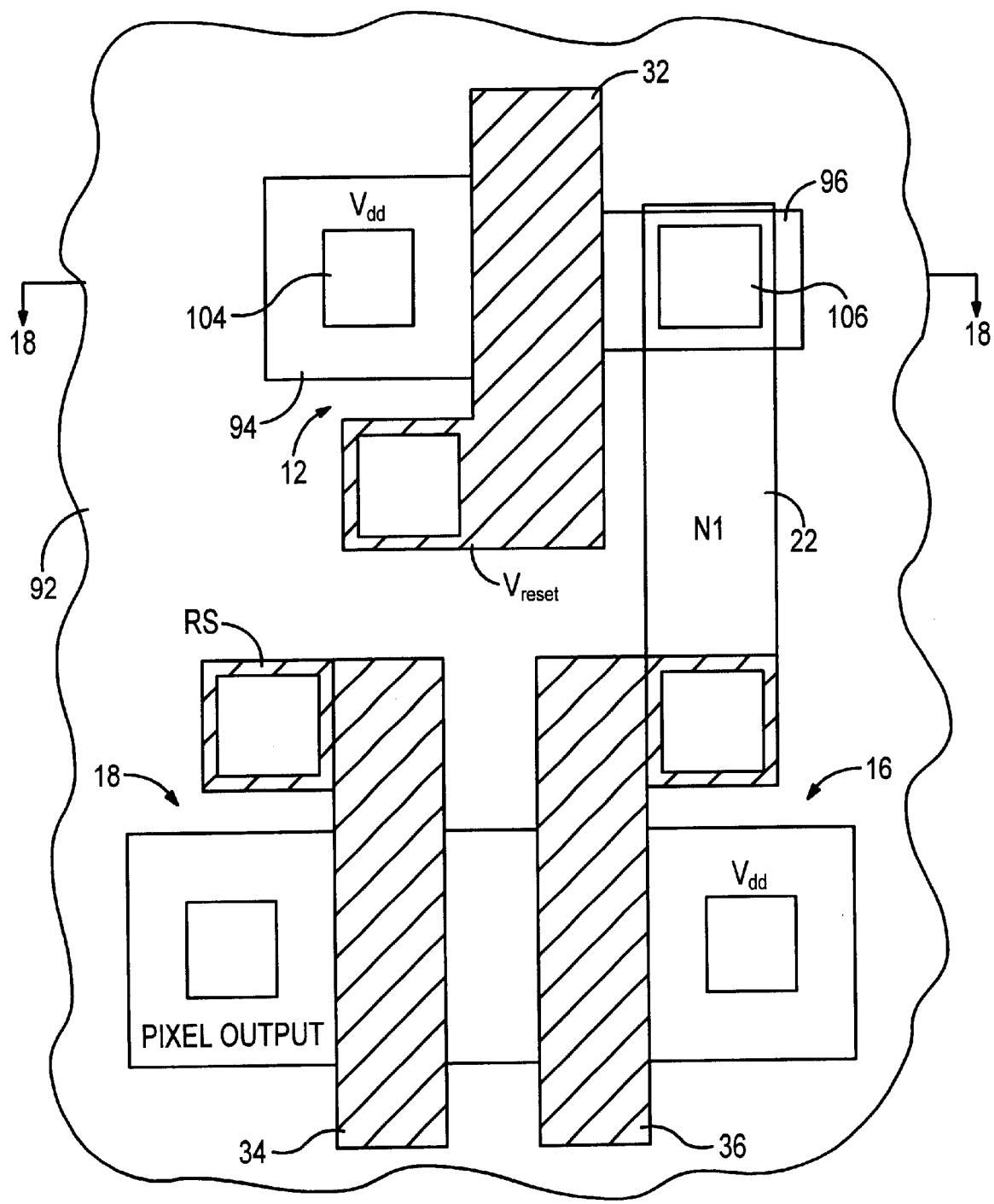
FIG. 17 is a top view of a circuit layout of layers and diffusion regions for forming an overlay photodiode in accordance with the prior art.

There are advantages to implementing a CMOS APS pixel 10 of the type shown in FIG. 1 using a photodiode 14 that overlays the underlying CMOS chip. One advantage is that the bulk photodiode is removed from the substrate, so that the only diode that can contribute to dark current is the one formed by the source diffusion of the reset transistor, which has a much smaller area than the substrate embedded photodiode 14 of FIG. 3. An exemplary circuit layout of an overlay photodiode arrangement is shown in the top view of FIG. 17 and the side sectional view of FIG. 18. In the conventional approach, the reset transistor 12 is formed using conventional techniques. As a result, a FOX region 92 and source/drain regions 94 and 96 are formed in a substrate 98. A gate oxide layer 100 and the polysilicon gate 32 are patterned before ion implantation forms the source/drain regions.

Figure 18:
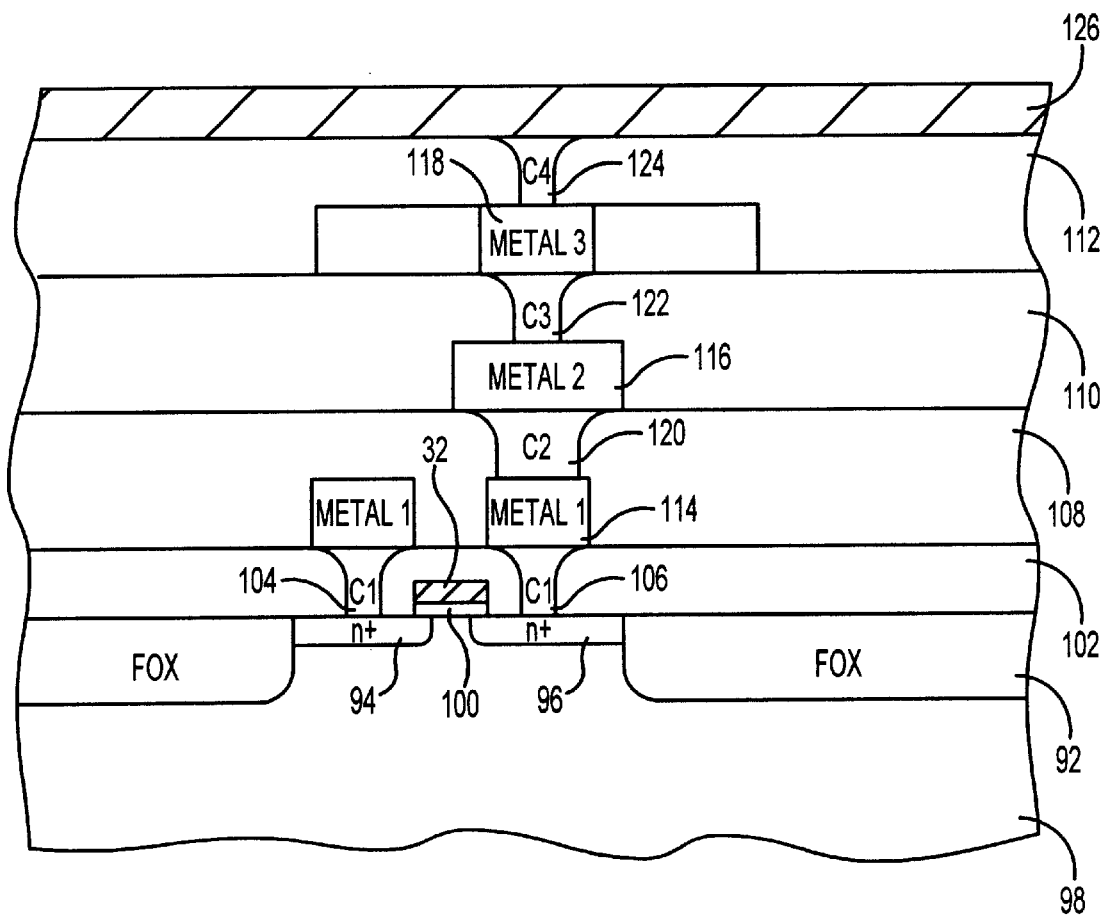
FIG. 18 is a side sectional view of the prior art device of FIG. 17, taken along lines 18—18.

After the transistors 12, 16 and 18 are formed at the substrate level, a dielectric layer 102 is deposited at the same level as formation of a pair of contacts 104 and 106 to the source/drain regions 94 and 96. Other dielectric layers 108, 110 and 112 are formed, with each level of dielectric material including a patterned metal 114, 116 and 118, as well as a patterned contact 120, 122 and 124. The patterned metal layers and contact layers form a via from the transistor 12 to an overlay photodiode 126. Correlating FIGS. 17 and 18, the portion of the metal layer 114 that resides above the contact 106 (C1) in FIG. 18 is the node 22 (N1) in FIG. 17.

Figure 19:
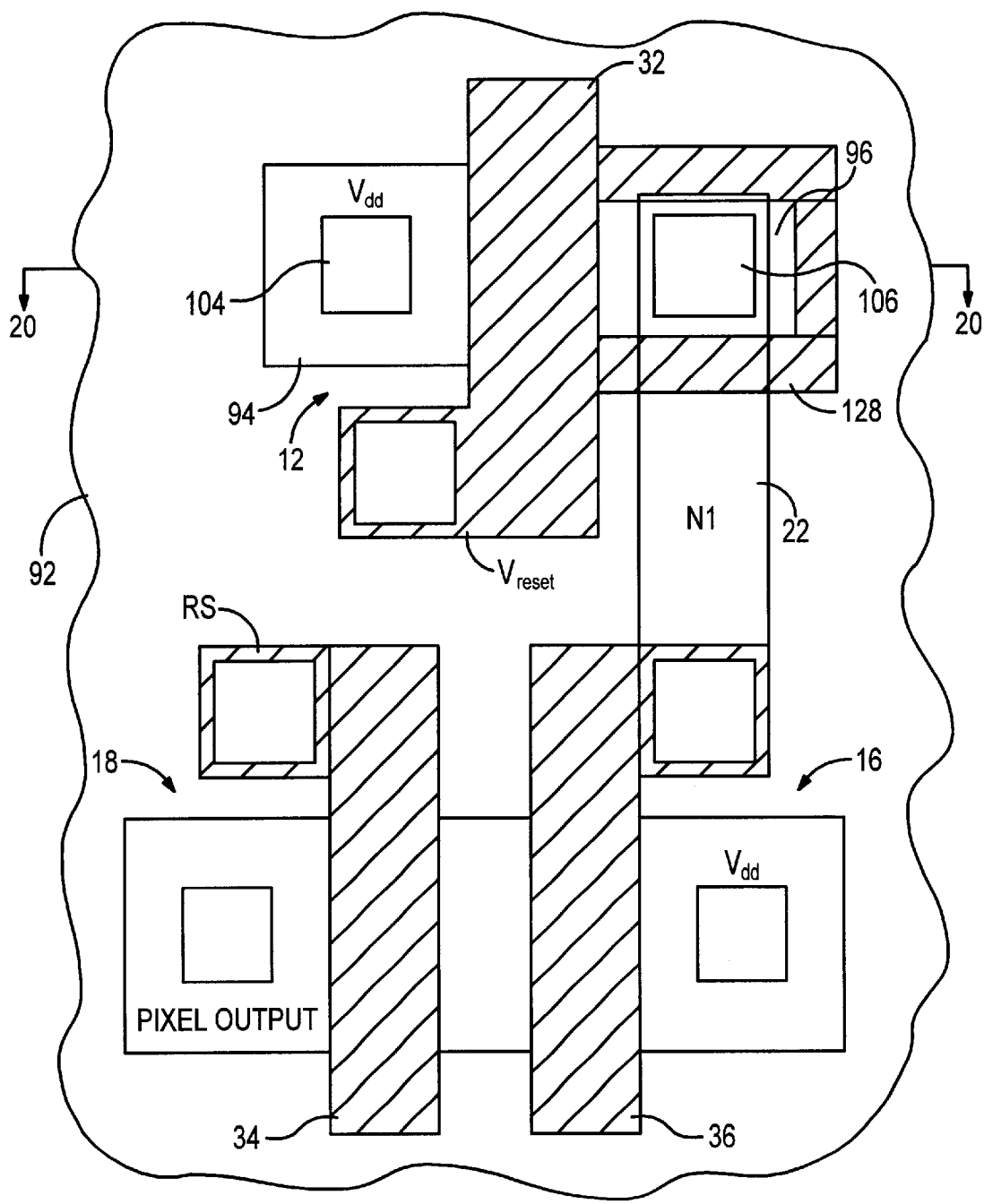
FIG. 19 is a top view of a circuit layout of the layers and diffusion regions of FIG. 17, but with a guard layer in accordance with the invention.
Figure 20:
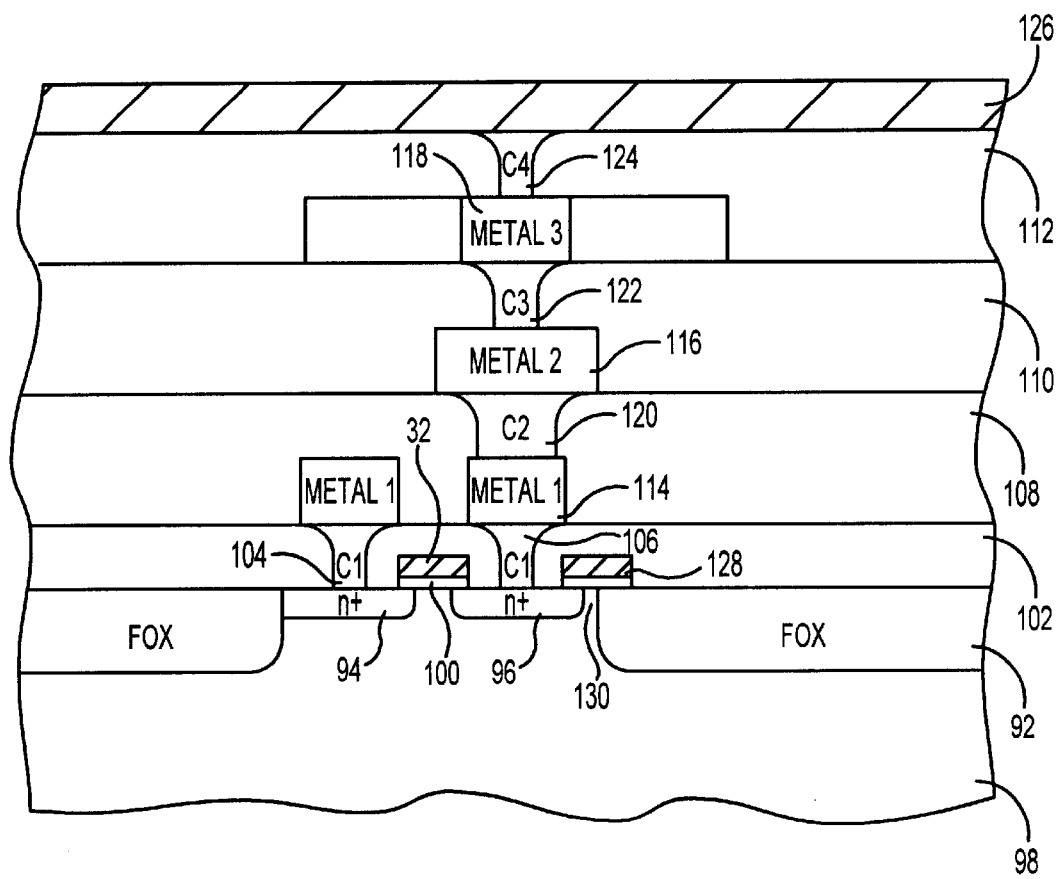
FIG. 20 is a side sectional view of the device of FIG. 19, taken along lines 20—20.

Although the source diffusion 96 of the reset transistor 12 is relatively small, it may still induce a relatively large dark current, especially in advanced deep-submicron CMOS technologies and in fact may be the largest contributor to dark current in the pixel. The approach of providing a polysilicon guard layer may be applied to the overlay photodiode structure in order to address this possibility. Specifically, a guard layer of polysilicon may be formed over the field-edge of the source diffusion in order to reduce dark current. Because the source diffusion 96 is a small portion of the total pixel area, adding the guard layer will result in only a small increase in pixel area. FIGS. 19 and 20 illustrate the overlay photodiode with the diffusion-inhibiting guard layer 128 about the source diffusion 96. The guard layer is formed before the dopant is introduced into the source region. Therefore, a transition strip that is relatively free of dopant is formed between the FOX 92 and the source region 96. The transition strip 130 is illustrated in FIG. 20.

Figure 21:
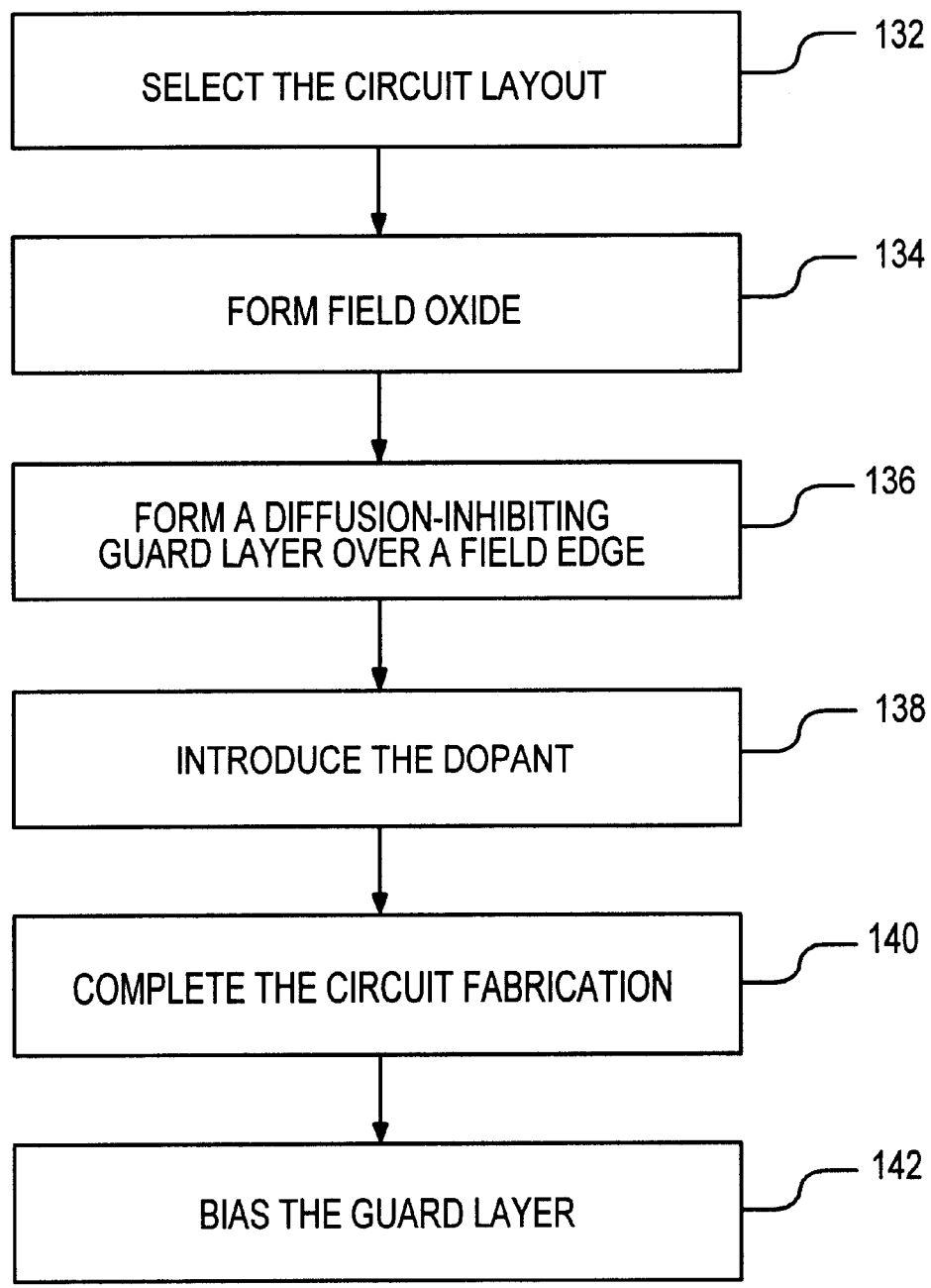
FIG. 21 is a process flow of steps for forming the circuits in accordance with the invention.

The steps for carrying out the invention will be described briefly with reference to FIG. 21. In step 132, a circuit layout is selected. In the preferred embodiment, the circuit layout defines layers of a CMOS imaging sensor having an array of APS pixels. The APS pixel 10 of FIG. 1 is merely one example. The array of pixels may be linear or may be two-dimensional.

In step 134, the field oxide regions are formed. Conventional techniques may be used to form these regions. The approach is not critical to the invention.

A diffusion-inhibiting guard layer is formed over selected field edges, as shown at step 136. Some of the alternatives were described and illustrated above. Preferably, the guard layer is formed of polysilicon and is formed simultaneously with the gates of transistors.

The dopant is introduced into the appropriate regions at step 138. The regions that are guarded by the guard layer that was formed in step 136 may be active area diode regions, source/drain diffusion regions, or both. The remainder of the circuit fabrication is then completed at step 140. The guard layer or guard layers are biased at step 142 in order to inhibit edge leakage.

What is claimed is:

1. A method of forming an active area diode for an imaging circuit comprising steps of:

forming a field oxide region on a substrate, said field oxide region having an edge that at least partially defines a geometry of an active area diode region;

forming a conductive layer on said substrate such that said conductive layer generally follows a contour of said edge of said field oxide region, while extending onto a peripheral portion of said active area diode region; and modifying electrical characteristics of said active area diode region such that said active area diode region is responsive to light energy, said conductive layer inhibiting said modification of said electrical characteristics within said peripheral region.

2. The method of claim 1 further comprising a step of connecting said conductive layer to a constant source of voltage.

3. The method of claim 1 wherein said step of modifying said electrical characteristics includes diffusing a dopant into said active area diode region.

4. The method of claim 1 wherein said step of forming said conductive layer includes patterning polysilicon to extend onto peripheral portions of each of said field oxide region and said active area diode region.

* * * * *